US009423663B2

(12) United States Patent
Tu et al.

(10) Patent No.: US 9,423,663 B2
(45) Date of Patent: Aug. 23, 2016

(54) METHOD FOR MANUFACTURING PATTERNED LAYER AND METHOD FOR MANUFACTURING ELECTROCHROMIC DEVICE (71) Applicant: AU Optronics Corporation, Hsin-Chu (TW)

(72) Inventors: Chun-Hao Tu, Hsin-Chu (TW); Ren-Hong Jhan, Hsin-Chu (TW); Hao-Lun Hsieh, Hsin-Chu (TW); Kuo-Sen Kung, Hsin-Chu (TW); Ting-Chun Lin, Hsin-Chu (TW); Jen-Pei Tseng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 252 days.

(21) Appl. No.: 14/186,498

(22) Filed: Feb. 21, 2014

(65) Prior Publication Data
US 2015/0053331 A1 Feb. 26, 2015

(30) Foreign Application Priority Data

Aug. 26, 2013 (TW) .............................. 102130484 A (51) Int. Cl.
C23C 14/35 (2006.01)
G02F 1/15 (2006.01)
G02F 1/155 (2006.01)

(52) U.S. Cl.
CPC ................ *G02F 1/15* (2013.01); *C23C 14/351* (2013.01); *G02F 1/155* (2013.01); *G02F 1/1508* (2013.01); *G02F 1/1523* (2013.01)

(58) Field of Classification Search
None
See application file for complete search history.

(56) References Cited

U.S. PATENT DOCUMENTS

| 4,488,781 | A | 12/1984 | Giglia | |
| 7,369,295 | B2 | 5/2008 | Morita et al. | |
| 7,453,435 | B2 | 11/2008 | Edwards | |
| 8,771,802 | B1 * | 7/2014 | Hays | B05D 1/007 427/458 |
| 2009/0291610 | A1 | 11/2009 | Sasaki | |
| 2013/0133814 | A1 | 5/2013 | Shang | |

FOREIGN PATENT DOCUMENTS

| CN | 101675178 | 3/2010 |
| EP | 2213761 | 8/2010 |
| TW | 201307599 | 2/2013 |
| TW | 201321878 | 6/2013 |

* cited by examiner

Primary Examiner — Barbara J Musser
(74) Attorney, Agent, or Firm — WPAT, PC; Justin King; Douglas A. Hosack (57) ABSTRACT A method for manufacturing a patterned layer includes the steps of: providing a substrate having a first surface and a second surface opposite to the first surface; providing a material source for supplying a plurality of charged particles, in which the first surface faces the material source; providing a magnetic element, in which the second surface is arranged between the magnetic element and the first surface; and depositing the charged particles on the first surface through using the magnetic element so as to form a patterned layer. A method for manufacturing an electrochromic device is disclosed as well.

18 Claims, 10 Drawing Sheets

METHOD FOR MANUFACTURING PATTERNED LAYER AND METHOD FOR MANUFACTURING ELECTROCHROMIC DEVICE

PRIORITY CLAIM AND CROSS-REFERENCE

This application claims priority to Taiwan application Serial Number 102130484, filed Aug. 26, 2013, the entirety of which is incorporated herein by reference.

BACKGROUND

1. Technical Field

The present disclosure relates to a method of forming a patterned layer and a method for manufacturing an electrochromic device.

2. Description of Related Art

The electrochromic technology possesses several advantages such as low power consumption, high contrast, memorized effect and excellent resistance to infrared ray; therefore, many researches have been devoted to the electrochromic technology. The electrochromic technology usually utilizes coloring material as a medium of exhibiting color. The coloring material has reversible oxidation and reduction states, and it appears different colors in oxidation and reduction states. Generally speaking, by providing voltage or electric current, the coloring material may experience an electrochemical reaction, in which the coloring material is transformed from the oxidation state to the reduction state or vice versa so as to change its color. The electrochromic technology can be applied to devices such as display devices, e-books and electronic signs. However, the conventional electrochromic devices suffer poor reliability, and therefore it is an aim to improve the reliability of the electrochromic devices. Besides, in the prior art, patterned layers in electrochromic devices are usually fabricated by photolithography techniques. The traditional photolithographic techniques have expensive manufacturing costs, and further inevitably produce chemical waste such as stripped photoresist, developing solution, etchant solution, and therefore is unfavorable to the environment protection.

SUMMARY

According to one aspect of the present disclosure, a method for manufacturing a patterned layer is provided. The method includes the steps of: providing a substrate having a first surface and a second surface opposite to the first surface; providing a material source for supplying a plurality of charged particles, wherein the first surface of the substrate faces the material source; providing a magnetic element, wherein the second surface is arranged between the magnetic element and the first surface; and depositing the charged particles on the first surface by utilizing the magnetic element, and thereby forming a patterned layer.

According to one embodiment of the present disclosure, the step of depositing the charged particles on the first surface comprises depositing the charged particles to form a layer having different thicknesses on at least two regions of the first surface so as to form the patterned layer.

According to one embodiment of the present disclosure, the magnetic element comprises a first magnetic element and a second magnetic element, and a direction of the magnetic moment of the first magnetic element is different form a direction of the magnetic moment of the second magnetic element.

According to one embodiment of the present disclosure, the direction of the magnetic moment of the first magnetic element is opposite to the direction of the magnetic moment of the second magnetic element.

According to one embodiment of the present disclosure, in the step of depositing the charged particles on the first surface, the magnetic element forms a magnetic field over the first surface, and a spatial relationship between a distribution of the magnetic field and the substrate is kept constant.

According to one embodiment of the present disclosure, in the step of depositing the charged particles on the first surface, the magnetic element forms a magnetic field over the first surface, and the charged particles form the patterned layer having a recess portion on the first surface through the magnetic field.

According to one embodiment of the present disclosure, the magnetic element comprises a plurality of first magnetic elements and a plurality of second magnetic elements, and the first and the second magnetic elements are alternatively arranged, wherein a direction of a magnetic moment of each of the first magnetic elements is parallel to a first direction, and a direction of a magnetic moment of each of the second magnetic elements is parallel to a second direction that is opposite to the first direction.

According to one embodiment of the present disclosure, the magnetic element is fixed on the second surface of the substrate.

According to one embodiment of the present disclosure, the method further comprises disposing the substrate in a reaction chamber, wherein the reaction chamber has a material source therein, and the material source and the magnetic element are positioned at opposite sides of the substrate.

According to one aspect of the present disclosure, a method for manufacturing an electrochromic device is provided. The method comprises the steps of: providing a first substrate, and forming a first conductor layer on the first substrate; providing a second substrate, and forming a second conductor layer on the second substrate; and forming an electrochromic layer and an electrolyte layer between the first and the second conductor layers; wherein at least one of the steps of forming the first conductor layer, forming the second conductor layer, forming the electrochromic layer and forming the electrolyte layer comprise: providing a material source to provide a plurality of charged particles; disposing a first surface of the first substrate to face the material source; providing a magnetic element, wherein the magnetic element and the source material are positioned at opposite sides of the first substrate; and depositing the charged particles on the first surface through using the magnetic element so as to form the first conductor layer, the second conductor layer, the electrolyte layer or the electrochromic layer.

According to one embodiment of the present disclosure, the step of forming the electrolyte layer comprises forming an ion storage layer and a solid electrolyte layer.

According to one embodiment of the present disclosure, the electrochromic layer comprises tungsten oxide, nickel oxide, vanadium oxide, copper oxide, ferric ferrocyanide ($Fe_4[Fe(CN)_6]_3$), polyaniline, viologen, molybdenum oxide, niobium oxide, titanium dioxide, iridium oxide, indium tin oxide or a combination thereof.

According to one embodiment of the present disclosure, the step of depositing the charged particles on the first surface comprises depositing the charged particles to form a layer having different thicknesses on at least two regions of the first surface.

According to one embodiment of the present disclosure, the magnetic element comprises a first magnetic element and a second magnetic element, and a direction of a magnetic moment of the first magnetic element is different from a direction of a magnetic moment of the second magnetic element.

According to one embodiment of the present disclosure, the direction of the magnetic moment of the first magnetic element is opposite to the direction of the magnetic moment of the second magnetic element.

According to one embodiment of the present disclosure, the step of depositing the charged particles on the first surface comprises arranging the first magnetic element to correspond to a first region of the first surface, and arranging the second magnetic element to correspond to a second region of the first surface, and forming a deposited layer on the first region and the second region in different thicknesses.

According to one embodiment of the present disclosure, the magnetic element forms a magnetic field over the first surface, and a spatial relationship between a distribution of the magnetic field and the substrate is kept constant in the step of depositing the charged particles on the first surface.

According to one embodiment of the present disclosure, the magnetic element comprises a plurality of first magnetic elements and a plurality of second magnetic elements, and the first and the second magnetic elements are alternatively arranged, in which a direction of a magnetic moment of each of the first magnetic elements is parallel to a first direction, and a direction of a magnetic moment of each of the second magnetic elements is parallel to a second direction that is opposite to the first direction.

BRIEF DESCRIPTION OF THE DRAWINGS

The disclosure can be more fully understood by reading the following detailed description of the embodiments, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In the drawings, the thickness and width of layers and regions may be exaggerated for clarity. Like reference numerals in the drawings denote like elements. The elements and regions illustrated in the figures are schematic in nature, and thus relative sizes or intervals illustrated in the figures are not intended to limit the scope of the present disclosure.

Further, spatially relative terms, such as "below," "beneath," "above," "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1A:
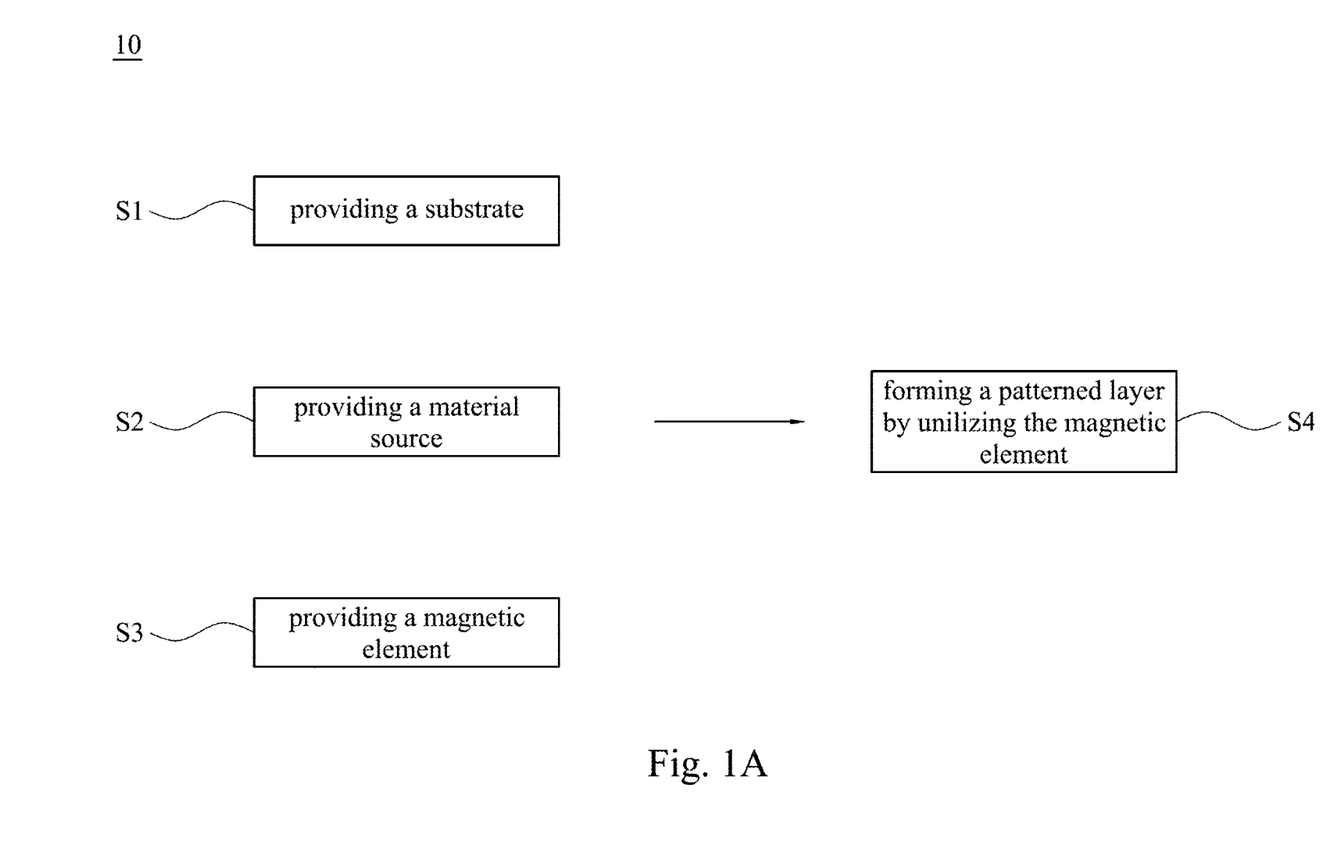
FIG. 1A is a flow chart illustrating a method for manufacturing a patterned layer according to one embodiment of the present disclosure.

According to one aspect of the present disclosure, a method for manufacturing a patterned layer is disclosed. FIG. 1A is a flow chart illustrating a method 10 for manufacturing a patterned layer according to one embodiment of the present disclosure. The method 10 comprises at least steps S1, S2, S3, and S4. In step S1, a substrate is provided. In step S2, a material source is provided. In step S3, a magnetic element is provided. In step S4, a patterned layer is formed by utilizing the magnetic element. The specific embodiment and details of each step will be well described hereinafter. It is noted that the sequence of performing steps S1, S2 and S3 is not restricted to any order. More specifically, there is no specific limitation on the chronological order between one of steps S1, S2 and S3 and another one of the steps S1, S2 and S3. For example, steps S1, S2 and S3 may be conducted simultaneously, or be conducted in sequence. In other embodiments, step S2 may be conducted first, and thereafter step S1 and step S3 are conducted simultaneously; or alternatively the three steps may be conducted in the sequence of step S2, step S3 and step S1. Otherwise, step S1 may be the first, step S3 is the second, and step S2 is the third. In other words, the order of conducting steps S1, S2 and S3 is random in the present disclosure.

Figure 1B:
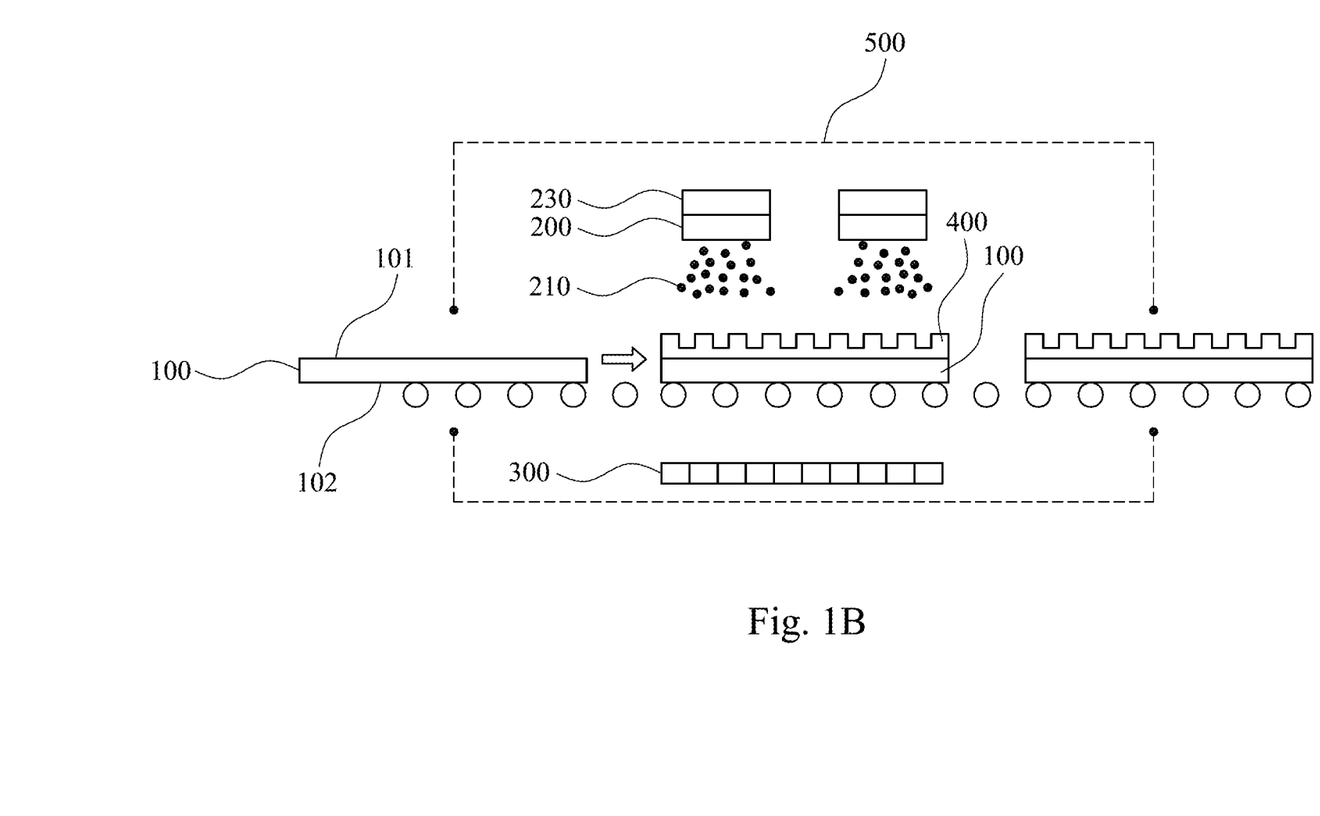
FIG. 1B is a cross-sectional view schematically illustrating the process stages in the method according to one embodiment of the present disclosure.

FIG. 1B is a cross-sectional view schematically illustrating the process stages in the method 10 according to one embodiment of the present disclosure. Referring to FIG. 1A and FIG. 1B, in step S1, a substrate 100 is provided. The substrate 100 has a first surface 101 and a second surface 102, and the first surface 101 is opposite to the second surface 102. For instance, the first surface 101 may be a process surface, and the second surface 102 is a back surface. The material of the substrate 100 is non-limited. For example, it may be a glass substrate or a polymeric substrate. In addition, the substrate 100 may be a rigid substrate or a flexible substrate.

In step S2, a material source 200 is provided for supplying a plurality of charged particles 210. The first surface 101 of the substrate 100 faces the material source 200. In one embodiment, method 10 further comprises disposing the substrate 100 in a reaction chamber 500 which includes the material source 200, depicted in FIG. 1B. The reaction chamber 500 may be a sputtering chamber or other types of deposition chambers. Hereinafter, a sputtering process is taken as an illustrative example to further explain the method 10, and the present disclosure, however, is not limited to the sputtering process. In the present disclosure, the term "material source" refers to a source of material supply which provides material in forming a patterned layer, for example a target used in the sputtering process. To be specific, the material source 200 may be, for example, a circular target. Furthermore, the number of the target is not limited to a sole one. For example, a plurality of targets may be used in dual-cathodes sputtering processes. In one embodiment, the material source 200 is capable of providing positively charged particles 210, and the reaction chamber 500 is a radio frequency sputtering chamber. The reaction chamber 500 is equipped with a cathode 230 on which the material source 200 is disposed.

In step S3, a magnetic element 300 is provided, as depicted in FIG. 1B. The magnetic element 300 and the material source 200 are disposed on the opposite sides of the substrate 100. In particular, the second surface 102 of the substrate 100 is positioned between the magnetic element 300 and the first surface 101 of the substrate 100. In one embodiment, the magnetic element 300 is disposed at the side neighboring the second surface 102, and the magnetic element 300 is moved with the substrate 100 in the sputtering process.

In another embodiment, the magnetic element 300 may be fixed on the second surface 102 of the substrate 100, and thereby allowing the magnetic element 300 to form a magnetic field over the first surface 101 of the substrate 100. In the subsequent step S4, the distribution of the magnetic field formed by the magnetic element 300 is kept invariable relative to the substrate 100.

Figure 2:
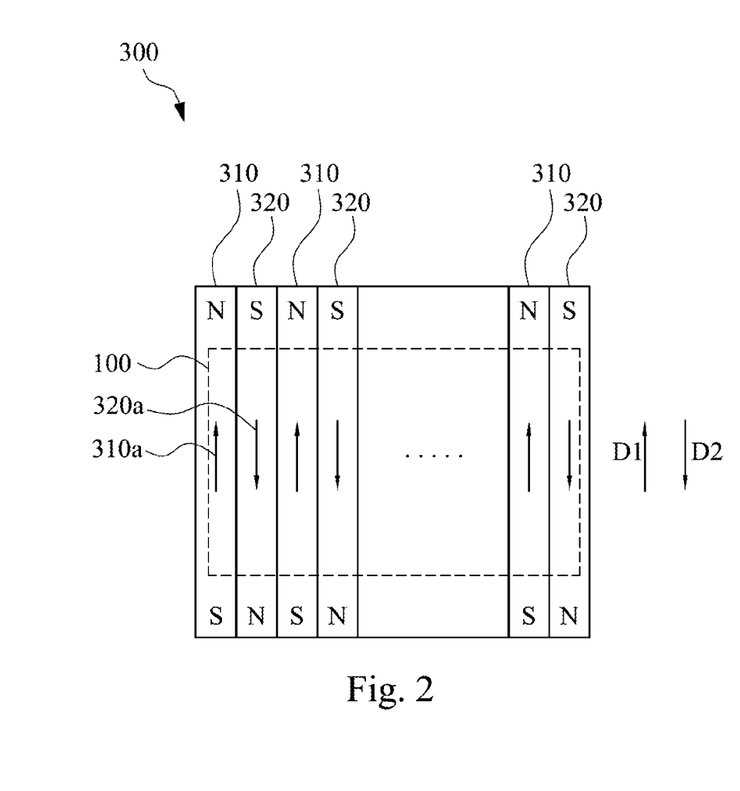
FIG. 2 is a top view schematically showing a magnetic element according to one embodiment of the present disclosure.

FIG. 2 is a top view schematically illustrating the magnetic element 300 according to one embodiment of the present disclosure. In this embodiment, the magnetic element 300 comprises at least a first magnetic element 310 and at least a second magnetic element 320, and the direction of the magnetic moment 310a in the first magnetic element 310 is different from that in the second magnetic element 320. Each of the first magnetic element 310 and the second magnetic element 320 has a north pole N and a south pole S. Herein, the term "the direction of the magnetic moment" refers to a direction which points from the south pole S to the north pole N in the magnetic element. In one example, the direction of the magnetic moment 310a of the first magnetic element 310 is opposite to the direction of the magnetic moment 320a of the second magnetic element 320.

In one illustrative embodiment, the magnetic element 300 contains a plurality of first magnetic elements 310 and a plurality of second magnetic elements 320, as depicted in FIG. 2. The first magnetic elements 310 and second magnetic elements 320 are alternately arranged. The direction of the magnetic moment of each first magnetic element 310 is parallel to a first direction D1, and the direction of the magnetic moment of each second magnetic element 320 is parallel to a second direction D2, in which the first direction D1 is opposite to the second direction D2.

Figure 3:
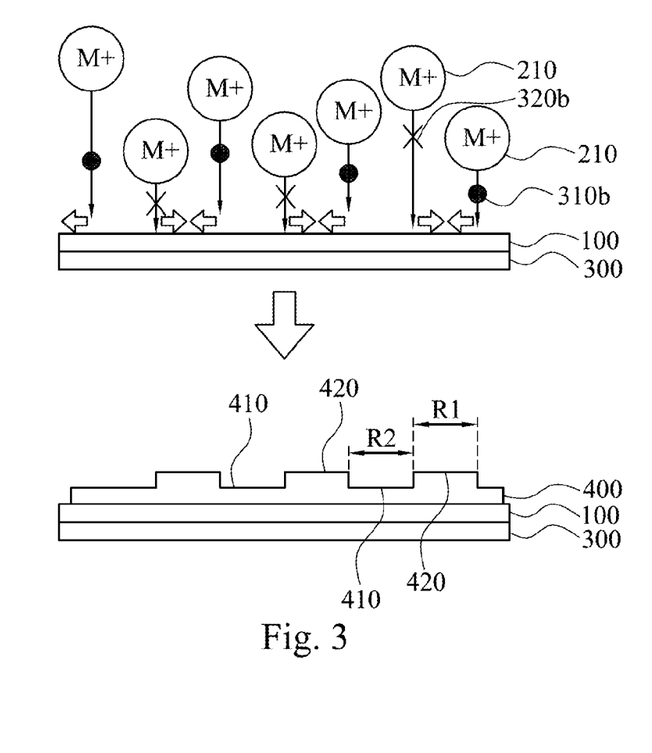
FIG. 3 is a cross-sectional view schematically illustrating the mechanism of depositing the patterned layer in connection with the embodiment shown in FIG. 2.

In step S4, through utilizing the magnetic element 300, the charged particles 210 generated by the material source 200 are deposited on the first surface 101 of the substrate 100 so as to form a patterned layer 400. In order to clearly illustrate the mechanism of forming the patterned layer 400, FIG. 3 is a cross-sectional view schematically illustrating the mechanism of depositing the patterned layer in connection with the embodiment shown in FIG. 2. With reference to FIG. 2 and FIG. 3, each first magnetic element 310 forms a magnetic field 310b (depicted in FIG. 3) over the first surface 101 of the substrate 100, and each second magnetic element 320 forms a magnetic field 320b (depicted in FIG. 3) over the first surface 101 of the substrate 100. In FIG. 3, the symbol "x" represents a magnetic field having a direction that penetrates into the paper surface of FIG. 3 from a position above the paper surface, and the symbol "●" represents a magnetic field having a direction which points upwards and leaves out of the paper surface of FIG. 3. Because the arrangement of the north pole N and the south pole S of the first magnetic element 310 is opposite to that of the second magnetic element 320, the direction of the magnetic field 310b over the first surface 101 of the first magnetic element 310 is opposite to that of the magnetic field 320b over the first surface of the second magnetic element 320. The moving charged particles 210 interact with the magnetic field 310b and that creates Lorentz force which makes the charged particles 210 move to the left. To the contrary, the interaction between the charged particles 210 and the magnetic field 320b makes the charged particles 210 move to the right. As a result, when the charged particles 210 deposit on the substrate 100, the deposited layer with a greater thickness is formed on the first region R1 of the substrate 100, and a deposited layer with a less thickness is formed on the second region R2 of the substrate. In other words, a convex portion 420 is formed on the first region R1, and a recess portion 410 is formed on the second region R2 so as to form the patterned layer 400. In one example, the first magnetic element 310 corresponds to the first region R1 of the substrate 100, and the second magnetic 320 corresponds to the second region R2 of the substrate 100. The thickness of the deposited layer is different between the first region R1 and the second region R2. In another example, the difference in thickness between the layer on the first region R1 and that on the second region R2 is about 800 to 1000 Angstrom.

Figure 4A:
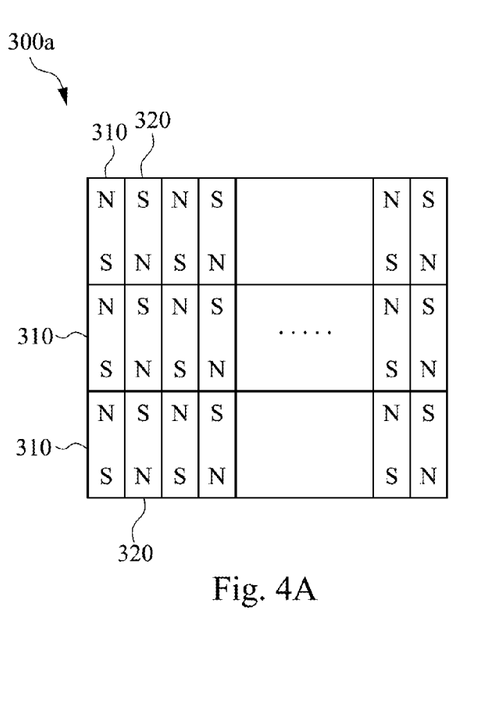
FIGS. 4A-4C are top views schematically illustrating magnetic elements according to various embodiments of the present disclosure.
Figures 4B, 4C:
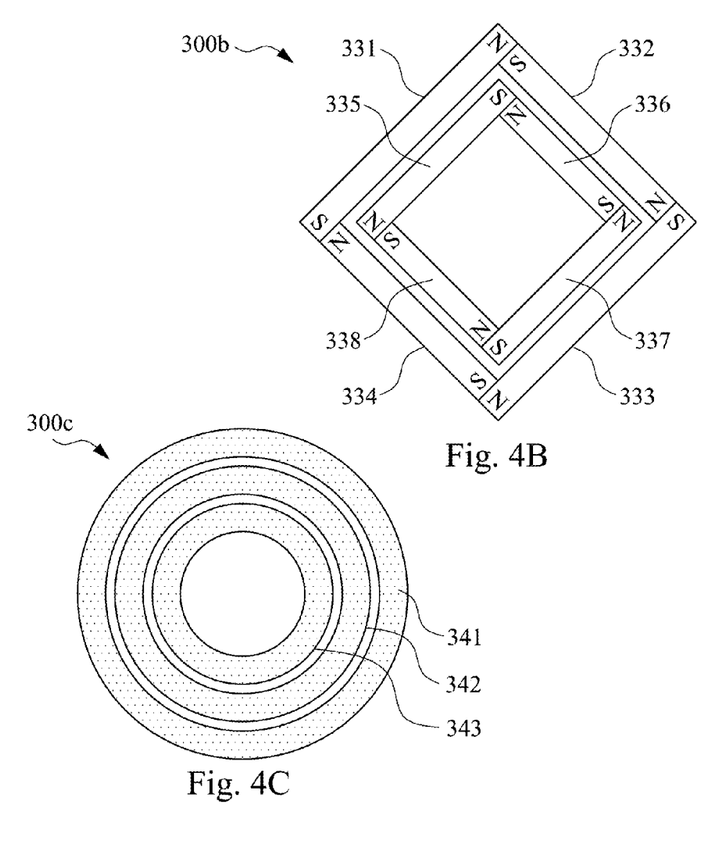

Stated differently, according to the embodiments of the present disclosure, it may control the surface contour or pattern of the patterned layer 400, as well as the position, arrangement, shape and size of both the convex portion 420 and the recess portion 410 by designing the shape, quantity and arrangement of the magnetic element 300. The appearance, shape, quantity and arrangement of the magnetic element 300 have a number of possibilities. In one embodiment, as depicted in FIG. 4A, the magnetic element 300a includes a plurality of first magnetic elements 310 and a plurality of second magnetic elements 320 which are arranged in a way depicted in FIG. 4A. In another embodiment, as shown in FIG. 4B, the magnetic element 300b includes magnetic elements 331, 332, 333, 334, 335, 336, 337 and 338. The magnetic elements 331 to 334 are arranged in a rhombus outline, and so are the magnetic elements 335 to 338. The magnetic elements 331 to 334 surround the magnetic elements 335 to 338. In other embodiments, as depicted in FIG. 4C, the magnetic element 300c includes a plurality of ring-typed magnetic elements 341, 342, and 343 which are arranged concentrically. According to the embodiments disclosed herein, one skilled in the art may alter or modify the appearance, shape and quantity of the magnetic element to attain the technical effect of the present disclosure.

There is no specific limitation on the material of the patterned layer 400 as long as it may create charged particles in the chamber. For instance, the suitable materials include, but not limited to, tungsten oxide ($WO_3$), nickel oxide ($NiO_x$), vanadium oxide ($V_2O_5$), copper oxide ($CuO_y$), ferric ferrocyanide ($Fe_4[Fe(CN)_6]_3$), polyaniline, viologen, molybdenum oxide ($MoO_3$), niobium oxide ($Nb_2O_3$), titanium dioxide ($TiO_2$), iridium oxide ($IrO_2$) or a combination thereof.

Figure 5A:
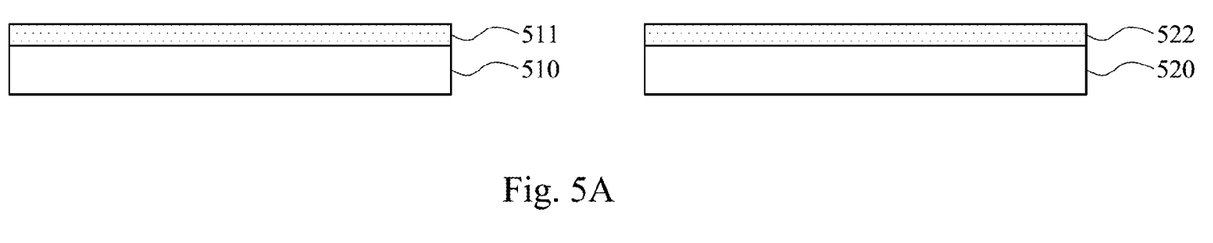
FIGS. 5A and 5B are cross-sectional views schematically illustrating the process stages of the method for manufacturing an electrochromic device according to one embodiment of the present disclosure.
Figure 5B:
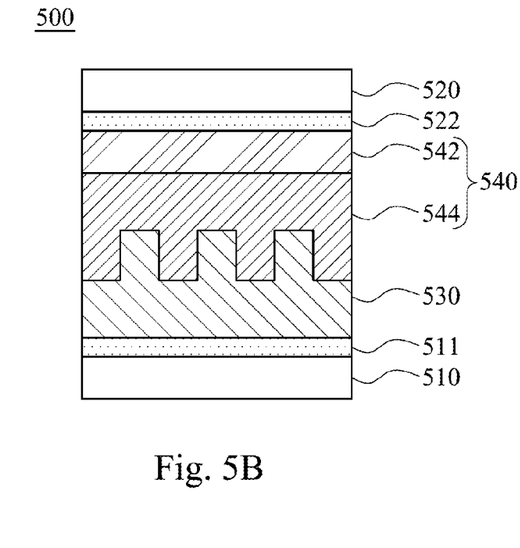

According to another aspect of the present disclosure, a method for manufacturing an electrochromic device is disclosed. FIGS. 5A and 5B are cross-sectional views schematically illustrating the process stages of the method for manufacturing the electrochromic device according to one embodiment of the present disclosure. As shown in FIG. 5A, a first substrate 510 and a second substrate 520 are provided. Thereafter, a first conductor layer 511 and a second conductor layer 522 are formed respectively on the first substrate 510 and second substrate 520. The sequence of providing the first substrate 510 and the second substrate 520 is not limited to any particular order, and the sequence of forming the first conductor layer 511 and the second conductor layer 522 is not limited to any particular order. The first substrate 510 and the second substrate 520 may be provided simultaneously, or one after the other. Similarly, the first conductor layer 511 and the second conductor layer 522 may be formed simultaneously, or one after the other.

Afterwards, as depicted in FIG. 5B, an electrochromic layer 530 and an electrolyte layer 540 are formed between the first conductor layer 511 and the second conductor layer 522 so as to form the electrochromic device 500. Specifically, the electrochromic layer 530 and the electrolyte layer 540 may be formed in sequence on the first conductor layer 511 of the first substrate 510, or the electrolyte layer 540 and the electrochromic layer 530 may be formed in sequence on the second conductor layer 522 of the second substrate 520. Otherwise, the electrochromic layer 530 may be formed on the first conductor layer 511, and the electrolyte layer 540 may be formed on the second conductor layer 522.

The electrochromic layer 530 has two reversible chemical states; that is, the oxidation state and the reduction state. The electrochromic layer 530 appears different colors in the two states. Applying voltage difference (or current) triggers the electrochemical reaction of the electrochromic layer 530 such that the electrochromic layer 530 is transformed from the oxidation state to the reduction state, or vice versa. Taken tungsten oxide for example, the chemical reaction may be represented as follows:

In the chemical reaction represented above, $WO_3$ is the oxidation state and is colorless and transparent, whereas $Li_xW^{(IV)}_{(1-x)}W^{(V)}_xO_3$ is the reduction state and appears blue color.

In one embodiment, the electrochromic layer 530 includes tungsten oxide ($WO_3$), nickel oxide ($NiO_x$), vanadium oxide ($V_2O_5$), copper oxide ($CuO_y$), ferric ferrocyanide ($Fe_4[Fe(CN)_6]_3$), polyaniline, viologen, molybdenum oxide ($MoO_3$), niobium oxide ($Nb_2O_3$), titanium dioxide ($TiO_2$), iridium oxide ($IrO_2$) or a combination thereof.

In another embodiment, the step of forming the electrolyte layer 540 comprises forming an ion storage layer 542 and a solid electrolyte layer 544. Any conventional ion storage layer and the electrolyte layer may be applied in the embodiments of the present disclosure.

At least one of the first conductor layer 511, the second conductor layer 522, the electrochromic layer 530 and the electrolyte layer 540 mentioned hereinbefore is formed by the method of manufacturing the patterned layer described hereinbefore in connection with FIG. 1A. To specify, the method comprises the steps of: providing a material source for supplying a plurality of charged particles; positioning the first surface of the first substrate to face the material source; providing a magnetic element, in which the magnetic element and the material source disposed on the opposite sides of the first substrate; depositing the charged particles produced from the material source onto the first surface by utilizing the magnetic element, and thereby forming the first patterned conductor layer 511, the second patterned conductor layer 522, the patterned electrolyte layer 540 or the patterned electrochromic layer 530.

In one embodiment, as shown in FIG. 5B, a patterned electrochromic layer 530 is formed by the method of manufacturing the patterned layer described hereinbefore in connection with FIG. 1A. The patterned electrochromic layer 530 has relatively large surface area which efficiently enhances the speed of the redox reaction and improves the reliability of the electrochromic device. In this regard, more details will be described hereinafter. In one specific example, the electrochromic layer 530 is formed of tungsten oxide by a sputtering process, in which the power is about 500 watts to about 1000 watts, and the molar ratio of oxygen in the chamber is about 0.33 to about 0.5. In some examples, the deposited patterned tungsten oxide layer has a height difference of about 800 angstroms to about 1000 angstroms.

Figure 5C:
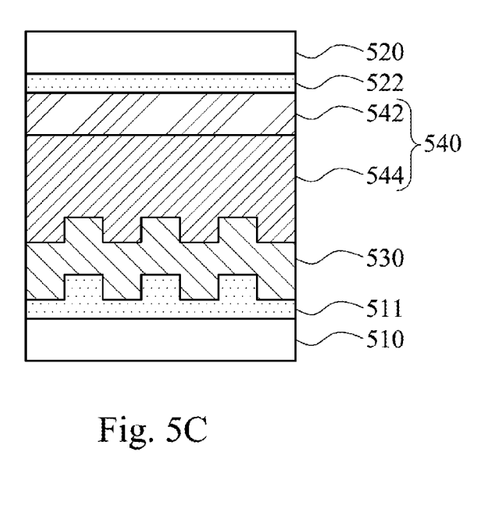
FIG. 5C a cross-sectional view schematically illustrating an electrochromic device according to another embodiment of the present disclosure.

In still another embodiment, as depicted in FIG. 5C, the first patterned conductor layer 511 is formed by the method of manufacturing the patterned layer described hereinbefore in connection with FIG. 1A. In this embodiment, the electrochromic layer 530 is deposited on the first patterned conductor layer 511, and therefore the surface contour of the electrochromic layer 530 undulates with the first conductor layer 511, and it leads to an increase in the surface area of the electrochromic layer 530. The first conductor layer 511 may be made of transparent conductive oxides such as indium tin oxide, indium oxide, zinc aluminum oxide and the like.

Figure 5D:
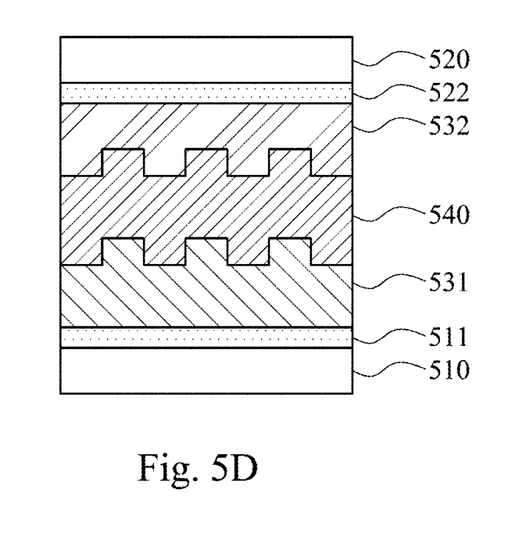
FIG. 5D a cross-sectional view schematically illustrating an electrochromic device according to still another embodiment of the present disclosure.

FIG. 5D is a cross-sectional view schematically illustrating an electrochromic device according to still another embodiment of the present disclosure. This embodiment is characterized in that a first patterned electrochromic layer 531 and a second patterned electrochromic layer 532 are respectively formed on the first conductor layer 511 and the second conductor layer 522 by the method of manufacturing the patterned layer described hereinbefore in connection with FIG. 1A. In one example, the first electrochromic layer 531 includes a coloring material which exhibits color in the reduction state, such as tungsten oxide, molybdenum oxide, niobium oxide, titanium dioxide, viologen, or a combination thereof. The second electrochromic layer 532 includes a coloring material which exhibits color in the oxidation state, such as nickel oxide, iridium oxide, ferric ferrocyanide, or a combination thereof.

Figure 6:
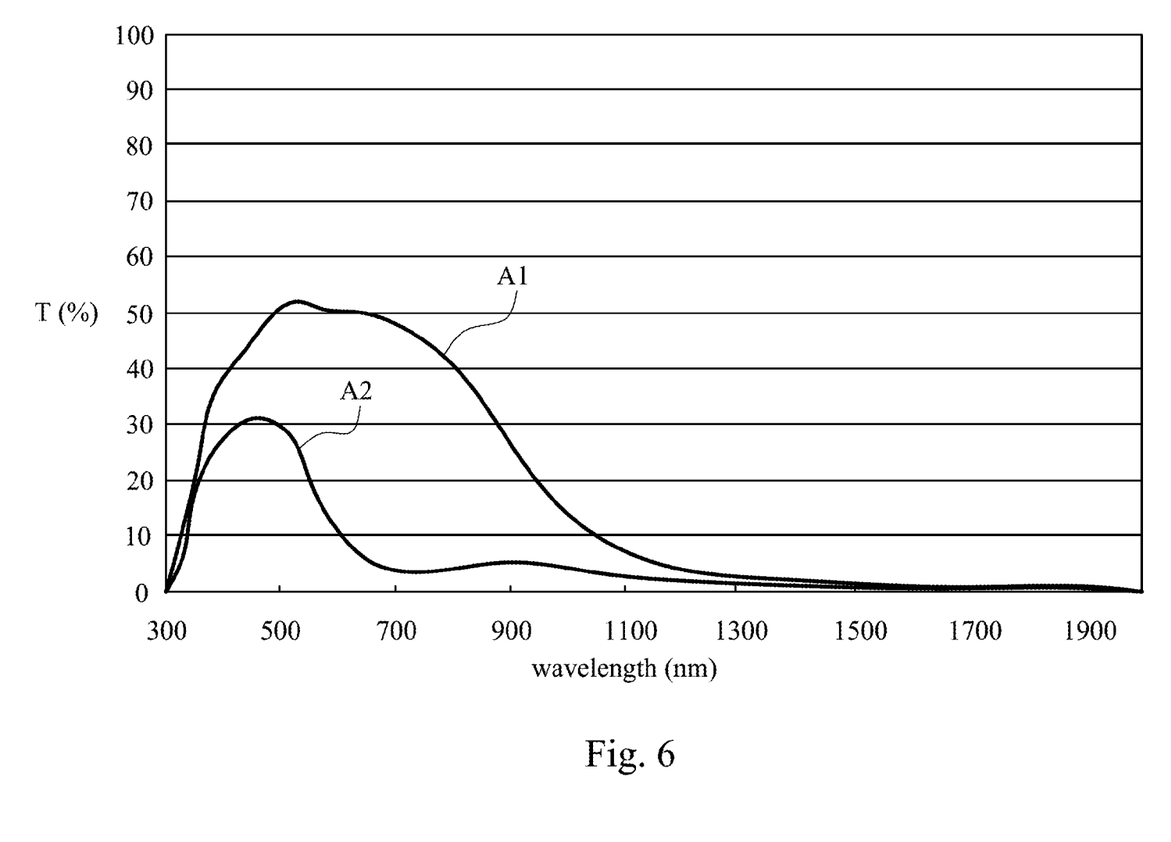
FIG. 6 is a diagram showing the transmittance spectrum (T) of an electrochromic device according to one embodiment of the present disclosure.

FIG. 6 is a diagram showing the transmittance spectrum (T) of an electrochromic device according to one embodiment of the present disclosure. In this embodiment, the electrochromic layer has a patterned electrochromic layer with a textured surface as depicted in FIG. 5B. In FIG. 6, curve A1 represents the transmittance spectrum of the electrochromic device in the transparent state, while curve A2 represents the transmittance spectrum of the electrochromic device that is transformed to the coloring state. After the electrochromic device has been transformed to the coloring state for a time period of thirty minutes, the transmittance spectrum is measured again, and the result is identical to curve A2. This result suggests that the electrochromic device is stable in the coloring state.

Figure 7:
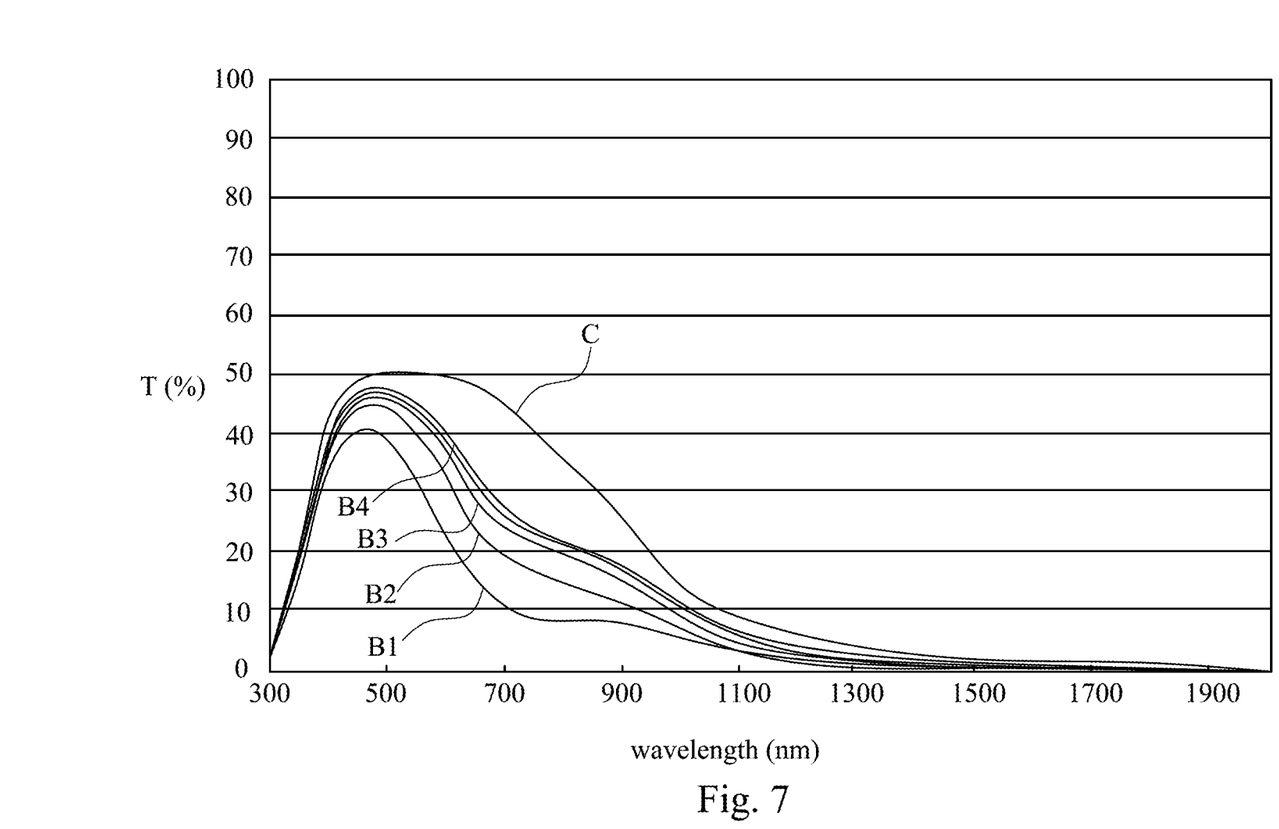
FIG. 7 is a diagram showing the transmittance spectrum (T) of an electrochromic device according to one comparative example of the present disclosure.

FIG. 7 is a diagram showing the transmittance spectrum (T) of an electrochromic device according to one comparative example of the present disclosure. In this comparative example, all the layers of the electrochromic device are substantially flat, without any textured pattern. In FIG. 7, Curve C represents the transmittance spectrum of the electrochromic device in the transparent state. Curve B1 represents the transmittance spectrum of the electrochromic device measured instantly when the device is transformed into the coloring state. Curve B2 represents the transmittance spectrum of the same electrochromic device when the device has been transformed into the coloring state for a time period of 5 minutes. Curve B3 represents the transmittance spectrum of the same electrochromic device when the device has been transformed into the coloring state for a time period of 15 minutes. Curve B4 represents the transmittance spectrum of the same electrochromic device when the device has been transformed into the coloring state for a time period of 30 minutes. From the results shown in FIG. 7, the electrochromic device of this comparative example is unstable in the coloring state, and a color fading phenomenon occurs in the coloring state of the electrochromic device. By making a comparison between the results shown in FIG. 6 and FIG. 7, it may be appreciated that the coloring state of the electrochromic device according to the embodiments of the present disclosure is stable. That is, the reliability of the electrochromic device according to the embodiments of the present disclosure is obviously superior to that of the electrochromic device in the comparative example.

Figure 8:
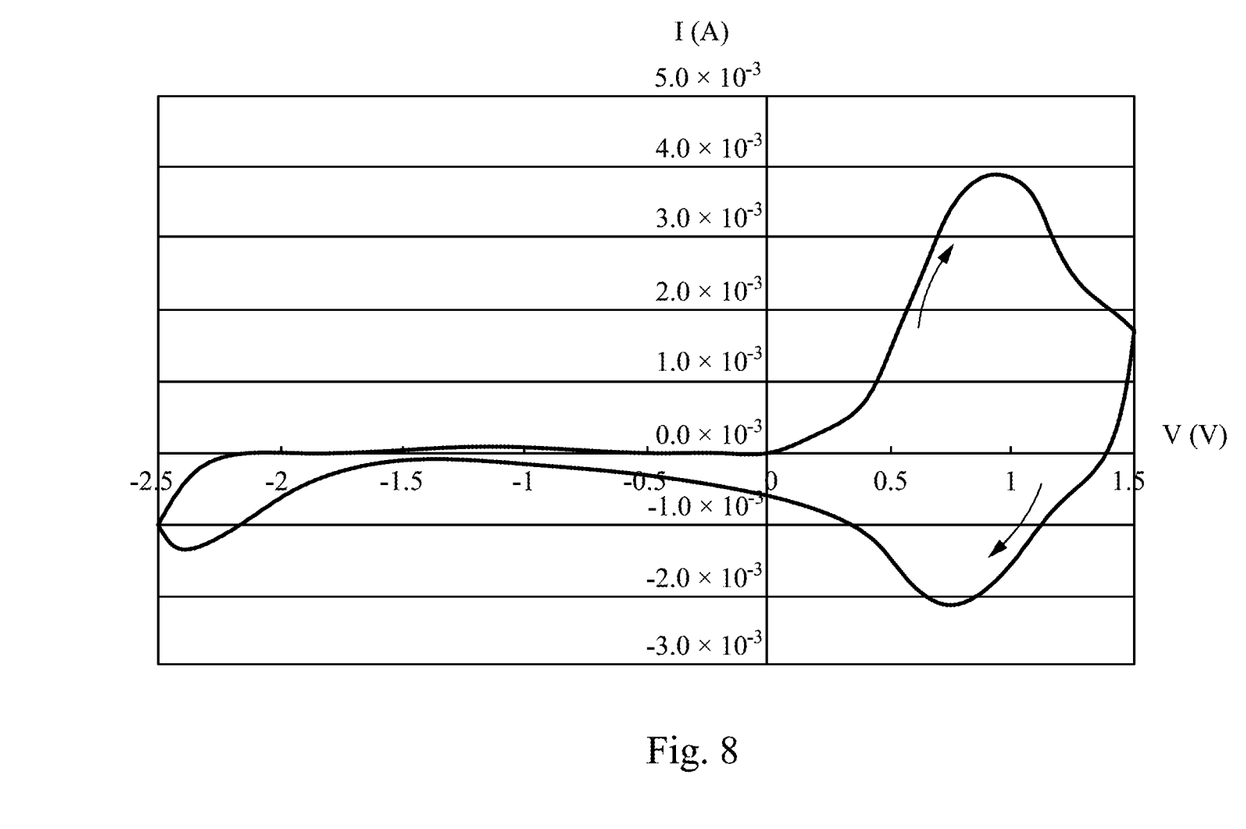
FIG. 8 is a diagram illustrating the relations between current (I) and voltage (V) of an electrochromic device according to one embodiment of the present disclosure.

FIG. 8 is a diagram illustrating the relations between current (I) and voltage (V) of an electrochromic device according to one embodiment of the present disclosure. In this embodiment, the electrochromic layer is a patterned electrochromic layer with a textured surface. In FIG. 8, the voltage between the first and second conductor layers is manipulated to measure the current between the first conductor layer and second conductor layer. At the beginning, the voltage is increased gradually from about 0 volt (V) to about 1.5 V, and the measured current increases from 0 ampere (A) to about $1.8 \times 10^{-3}$ A. In this procedure, a maximum current reaches to about $3.9 \times 10^{-3}$ A. Afterwards, the voltage is changed gradually from about 1.5 V to $-2.5$ V, and then from about $-2.5$ V up to 0 V bit by bit. From the result shown in FIG. 8, the maximum current is about $3.9 \times 10^{-3}$ A when the voltage is about 0.9 V.

Figure 9:
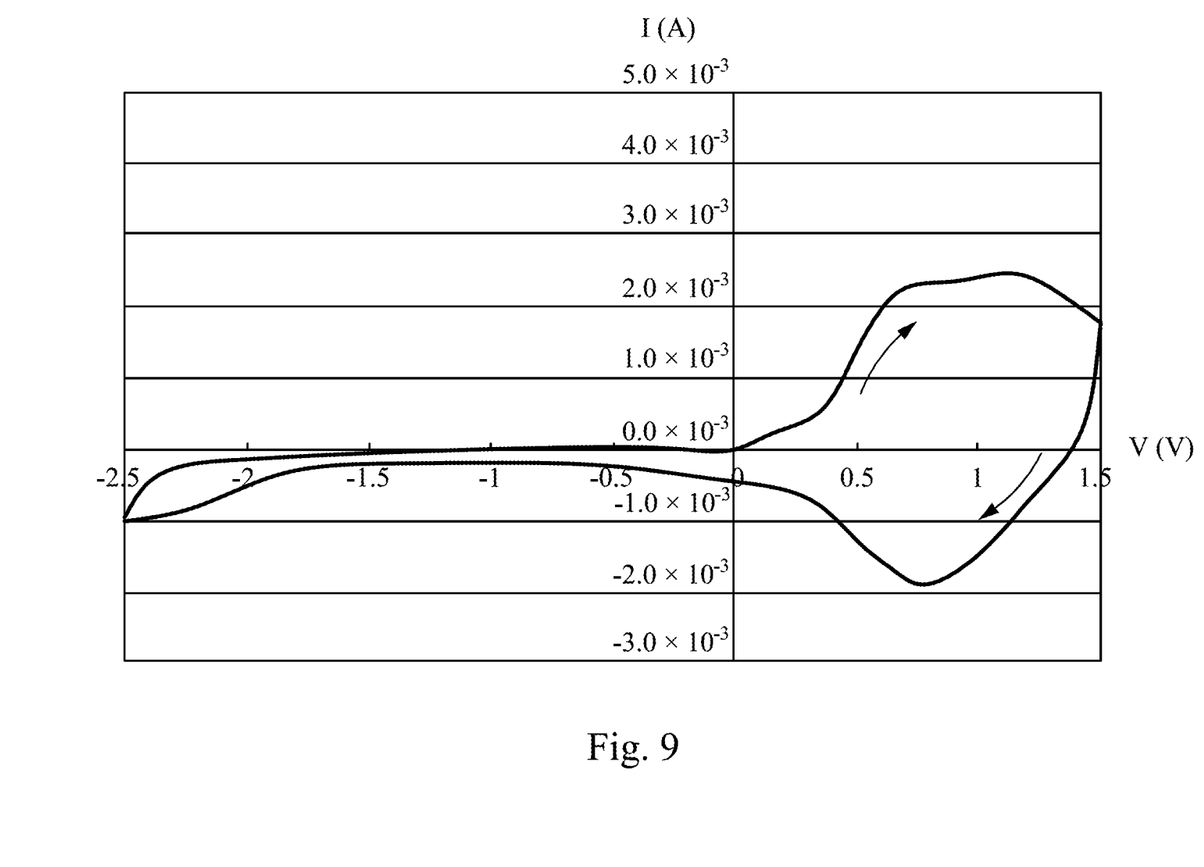
FIG. 9 is a diagram illustrating the relations between current (I) and voltage (V) of an electrochromic device according to one comparative example of the present disclosure.

FIG. 9 is a diagram illustrating the relations between current (I) and voltage (V) of an electrochromic device according to one comparative example of the present disclosure. In this comparative example, all the layers of the electrochromic device are substantially flat, without any textured pattern. The measurement approach in this comparative example is identical to that described hereinbefore in connection with FIG. 8. From the result shown in FIG. 9, it is found that the maximum current is about $2.4 \times 10^{-3}$ A when the voltage is about 1.1 V. With the comparison between the results shown in FIG. 8 and FIG. 9, it may be appreciated that the maximum current of the electrochromic device, according to the embodiment of the present disclosure, is obviously greater than that in the comparative example. This suggests that the redox reaction rate of the electrochromic device according to the embodiment of the present disclosure is higher than that in the comparative example.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a patterned layer, comprising:
    providing a substrate into a sputtering chamber, the substrate having a first surface and a second surface opposite to the first surface;
    providing a material source in the sputtering chamber for supplying a plurality of charged particles, wherein the first surface of the substrate faces the material source;
    providing a magnetic element in the sputtering chamber, wherein the second surface is arranged between the magnetic element and the first surface; and
    depositing the charged particles via sputtering on the first surface by utilizing the magnetic element, and thereby forming a patterned layer.

2. The method according to claim 1, wherein the step of depositing the charged particles on the first surface comprises depositing the charged particles to form a layer having different thicknesses on at least two regions of the first surface so as to form the patterned layer.

3. The method according to claim 1, wherein the magnetic element comprises a first magnetic element and a second magnetic element, and a direction of the magnetic moment of the first magnetic element is different from a direction of the magnetic moment of the second magnetic element.

4. The method according to claim 3, wherein the direction of the magnetic moment of the first magnetic element is opposite to the direction of the magnetic moment of the second magnetic element.

5. The method according to claim 1, wherein the magnetic element forms a magnetic field over the first surface, and a spatial relationship between a distribution of the magnetic field and the substrate is kept constant in the step of depositing the charged particles on the first surface.

6. The method according to claim 1, wherein the magnetic element forms a magnetic field over the first surface, and the charged particles forms the patterned layer having a recess portion on the first surface through the magnetic field in the step of depositing the charged particles on the first surface.

7. The method according to claim 1, wherein the magnetic element comprises a plurality of first magnetic elements and a plurality of second magnetic elements, and the first and the second magnetic elements are alternatively arranged, wherein a direction of a magnetic moment of each of the first magnetic elements is parallel to a first direction, and a direction of a magnetic moment of each of the second magnetic elements is parallel to a second direction that is opposite to the first direction.

8. The method according to claim 1, wherein the magnetic element is fixed on the second surface of the substrate.

9. The method according to claim 1, wherein the material source and the magnetic element are positioned at opposite sides of the substrate.

10. A method for manufacturing an electrochromic device, comprising:
    providing a first substrate, and forming a first conductor layer on the first substrate;
    providing a second substrate, and forming a second conductor layer on the second substrate; and forming an electrochromic layer and an electrolyte layer between the first and the second conductor layers;

wherein at least one of the steps of forming the first conductor layer, forming the second conductor layer, forming the electrochromic layer and forming the electrolyte layer comprise:

providing a material source to provide a plurality of charged particles;

disposing a first surface of the first substrate to face the material source;

providing a magnetic element, wherein the magnetic element and the source material are positioned at opposite sides of the first substrate; and depositing the charged particles on the first surface through using the magnetic element so as to form the first conductor layer, the second conductor layer, the electrolyte layer or the electrochromic layer.

11. The method according to claim 10, wherein the step of forming the electrolyte layer comprises forming an ion storage layer and a solid electrolyte layer.

12. The method according to claim 10, wherein the electrochromic layer comprises tungsten oxide, nickel oxide, vanadium oxide, copper oxide, ferric ferrocyanide (Fe4[Fe(CN6)3]), polyaniline, viologen, molybdenum oxide, niobium oxide, titanium dioxide, iridium oxide, indium tin oxide or a combination thereof.

13. The method according to claim 10, wherein the step of depositing the charged particles on the first surface comprises depositing the charged particles to form a layer having different thicknesses on at least two regions of the first surface.

14. The method according to claim 10, wherein the magnetic element comprises a first magnetic element and a second magnetic element, and a direction of a magnetic moment of the first magnetic element is different from a direction of a magnetic moment of the second magnetic element.

15. The method according to claim 14, wherein the direction of the magnetic moment of the first magnetic element is opposite to the direction of the magnetic moment of the second magnetic element.

16. The method according to claim 14, wherein the step of depositing the charged particles on the first surface comprises arranging the first magnetic element to correspond to a first region of the first surface, and arranging the second magnetic element to correspond to a second region of the first surface, and forming a deposited layer on the first region and the second region in different thicknesses.

17. The method according to claim 10, wherein the magnetic element forms a magnetic field over the first surface, and a spatial relationship between a distribution of the magnetic field and the substrate is kept constant in the step of depositing the charged particles on the first surface.

18. The method according to claim 10, wherein the magnetic element comprises a plurality of first magnetic elements and a plurality of second magnetic elements, and the first and the second magnetic elements are alternatively arranged, wherein a direction of a magnetic moment of each of the first magnetic elements is parallel to a first direction, and a direction of a magnetic moment of each of the second magnetic elements is parallel to a second direction that is opposite to the first direction.

* * * * *